(12) United States Patent
Ruff et al.

(10) Patent No.: US 6,351,024 B1
(45) Date of Patent: Feb. 26, 2002

(54) POWER SEMICONDUCTOR DIODE

(75) Inventors: Martin Ruff, Vestenbergsgreuth; Hans-Joachim Schulze, Ottobrunn, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/245,207

(22) Filed: Feb. 5, 1999

(30) Foreign Application Priority Data

Feb. 5, 1998 (DE) .......................................... 198 04 580

(51) Int. Cl.[7] .............................................. H01L 29/36
(52) U.S. Cl. ........................ 257/655; 257/656; 257/657
(58) Field of Search .............................. 257/497, 655, 257/656, 657, 46, 104, 121

(56) References Cited

U.S. PATENT DOCUMENTS

| | | | |
|---|---|---|---|
| 4,165,517 A | * 8/1979 | Temple et al. | ............... 257/173 |
| 4,757,031 A | 7/1988 | Kuhnert et al. | |
| 5,086,332 A | * 2/1992 | Nagakawa | ................... 257/657 |
| 5,284,780 A | 2/1994 | Schulze et al. | |
| 5,712,502 A | 1/1998 | Mitlehner et al. | |

FOREIGN PATENT DOCUMENTS

| | | |
|---|---|---|
| DE | 43 10 444 | 10/1994 |
| EP | 0 262 356 B1 | 4/1988 |
| JP | 63 127572 | * 5/1988 |
| WO | WO 96/03774 | 2/1996 |

OTHER PUBLICATIONS

Japanese Abstract, 6–37336, Feb. 10, 1994.
Japanese Abstract, 09246571 A, Sep. 19, 1997.

* cited by examiner

*Primary Examiner*—Nathan Flynn
*Assistant Examiner*—Ahmed N. Sefer
(74) *Attorney, Agent, or Firm*—Schiff Hardin & Waite

(57) ABSTRACT

A semiconductor body including a first surface, a second surface, and a base doping for electrical conductivity. A first doped region is on the first surface and a second doped is on the second surface. The two doped regions are doped with opposites signs for electrical conductivity. A contact is positioned on each of the two doped regions. Another region is within the semiconductor body and has an outer section in which the charge carrier concentration in the outer section is lower due to the reduction of the concentration of dopant in the first doped region and/or the increase of concentration of recombination centers in the outer section.

10 Claims, 5 Drawing Sheets

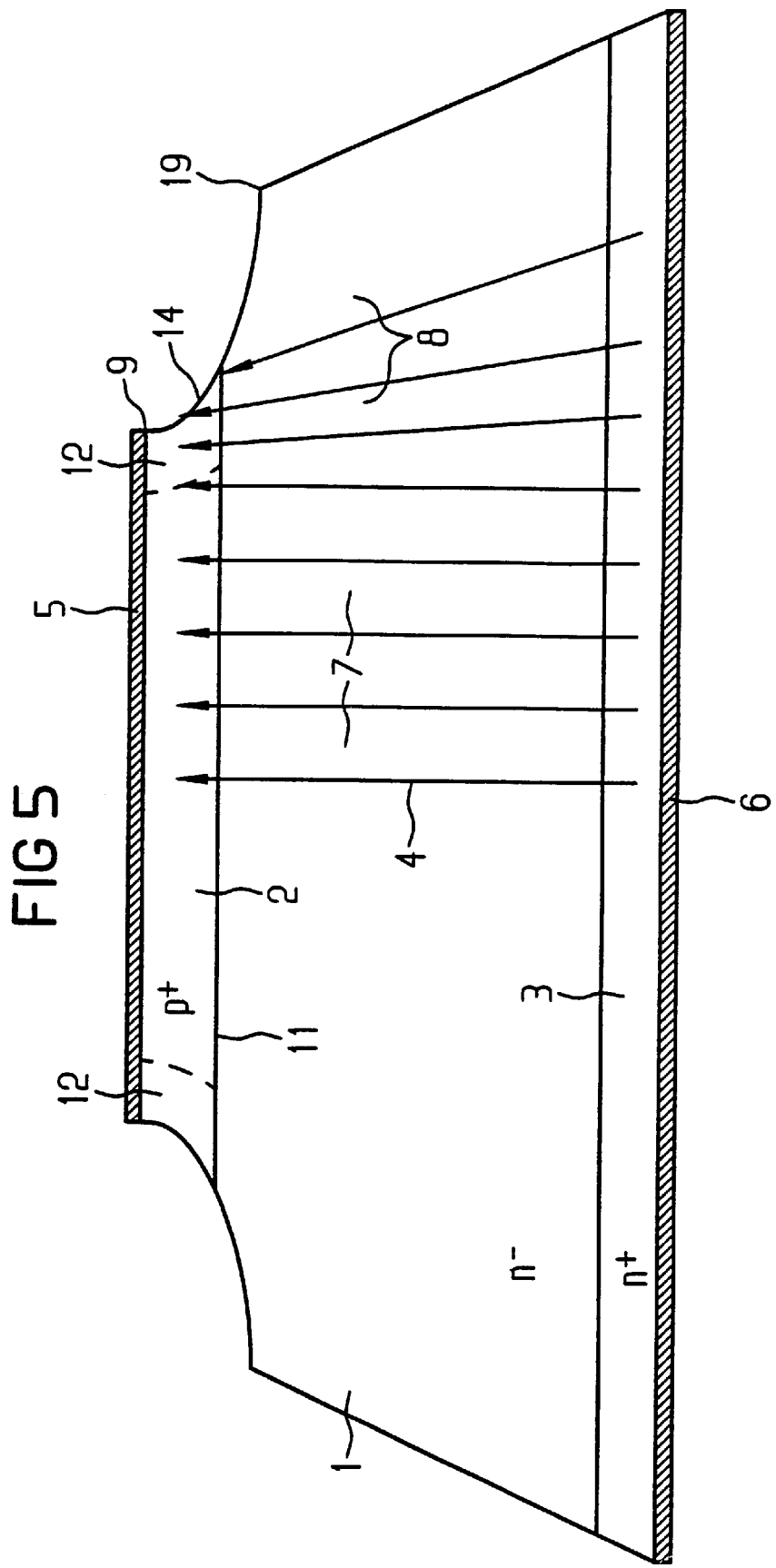

POWER SEMICONDUCTOR DIODE

BACKGROUND OF THE INVENTION

The present invention relates to a semiconductor diode. More particularly, the invention relates to semiconductor diodes which can be utilized in circuits that experience high voltages and currents.

A goal in the development of modem circuits is to reduce the number of required circuit components, such as capacitors or resistors. In particular, there is an attempt to reduce protective circuitry, which leads to increased loading of the components. Increased demands are thus placed on the loadability of these components with a sharp rise or fall in current or voltage.

Given rapid cut-off processes, a dynamic avalanche can occur in power diodes. This effect is brought about by holes (defector electrons) which flow to the anode through the space charge region which forms at the pn-junction. Given sufficiently large current densities, these charge carriers act as an additional doping of the semiconductor material in the area of the space charge region and can lead to the generation of additional charge carriers (avalanche effect). This occurs given electrical voltages which are far below the breakthrough voltage of the diode in the stationary operation. When the current flows through a component, the charge carriers diffuse from the active region in the edge region of the component. If a voltage applied in the forward direction is cut-off, the flowing of charge carriers present due to the diffusion process at the side of the p-emitter or the p-emitter contact can lead to increased current densities in the edge region by means of the terminal contacts. As a result, the component can be destroyed if the generation of charge carriers from the dynamic avalanche effect is too intense. This problem arises primarily when the n-emitter is larger or only negligibly smaller (i.e. by approximately the thickness of the component) than the p-emitter.

European Patent Document No. EP 0 262 356 B1 describes a method for producing a pn-junction of high voltage stability. In this example, the edge of a doped region constructed at the top surface of a semiconductor body has a boundary layer that forms a pn-junction. The pn-junction curves at the edge toward the top surface of the semiconductor body. The result is a gradually decreasing dopant concentration in an outward direction. To this end, a semiconductor layer is used on the top surface as a dopant source, and the dose of the in-diffusion of the dopant is progressively reduced, moving outward by a plurality of recesses of different widths which are etched out in this semiconductor layer.

U.S. Pat. No. 5,284,780 teaches a method for increasing the voltage stability of a semiconductor component with a plurality of layers of alternating conductivity types. With this method, the edge terminations of a pn-junction in a thyristor are irradiated with electrons in order to reduce the lifetime of the charge carriers in these regions. This reduces the current amplification in the edge region and increases the voltage stability of the component.

SUMMARY OF THE INVENTION

The present invention provides an improved power diode in semiconductor material that is suitable for use in circuits in which the diode is operated to the limits of its loading capacity.

To this end, in an embodiment of the present invention, a power diode includes a semiconductor body having a first surface, a second surface and a base doping for electrical conductivity. Two regions are doped with opposites signs for electrical conductivity. The first region is on the first surface and the second region is on the second surface. A first contact is on the first region and a second contact is on the second region. A third region is within the semiconductor body and has an outer section in which a reduction of the concentration of the dopant in the first region and/or an increasing of the concentration of recombination centers in the outer section lowers a charge carrier concentration in the outer section.

In an embodiment, the concentration of recombination centers in the outer region is increased by introducing a plurality of high energy particles into the outer region by irradiation.

In an embodiment, the concentration of recombination centers in the outer region is increased by introducing a numerous heavy-metal atoms into the outer region by irradiation.

In an embodiment, the first contact extends a predetermined distance across the first region, and the concentration of dopant in the first region is lower in two outer edge areas covered by the contact than the concentration of dopant in a middle area covered by the contact and extending between the two outer edge areas.

In an embodiment, the power diode has a thickness and the first contact has dimensions that are larger than the corresponding dimensions of the second contact by, at the most, the thickness of the power diode in every direction of the first surface.

In an embodiment, the second surface is longer than the first surface, the second contact extends across the entire second surface and the doping of the second region has a sign of conductivity that is the same as a conductivity of the base doping of the semiconductor body.

In an embodiment, concentration of dopant of the first region steadily decreases in a direction from the middle area to the two outer edge areas covered by the first contact.

In an embodiment, the concentration of dopant in the first and second regions is lower in an area covered by the respective first or second contacts and is positioned at the edge of the respective first or second contact than in a remaining area which is covered by the contact in the middle of the contact.

In an embodiment, an edge region is modified such that the dynamic avalanche effect described above is effectively suppressed or at least limited. The power diode has a structure of doped regions with a pn-junction in a semiconductor body. The pn-junction extends transversely to the main direction of the current path, which is defined by two regions which are doped for opposite signs of electrical charge. These regions are at the first surface and the second surface of a semiconductor body. The first and second surfaces each have a base doping with terminal contacts.

In the operation of the diode, the current flows through the semiconductor material essentially perpendicular to the first and second surfaces. At the edges of the current path, the inventive power diode is designed so that, in the on-state of the diode, the charge carrier concentration at the edge region is more sharply reduced than in the remaining area. Thus, given a cut-off of a current in the flow direction, high current levels resulting from charge carriers flowing off at the edges of the current path do not arise, particularly not in the region of the pn-junction beneath the edge of the $p^+$-contact.

It is thereby inventively achieved that multiple recombination centers are introduced in the edge region, or that the charge carrier injection in the operation of the diode is reduced progressively in the direction of the edge in that the doping concentration of an n$^+$-doped or a p$^+$-doped region on which a contact is placed (n-emitter or p-emitter, respectively) decreases proceeding toward the edge. These means can also be present simultaneously.

These and other advantages and/or features of the present invention are described below in the following detailed description of the preferred embodiments with reference to the accompanying drawings.

BRIEF DESCRIPTION OF THE DRAWINGS

FIG. 5 is a cross-sectional view of an embodiment the semiconductor diode with a mesa.

DETAILED DESCRIPTION OF THE PREFERRED EMBODIMENTS

Figure 1:
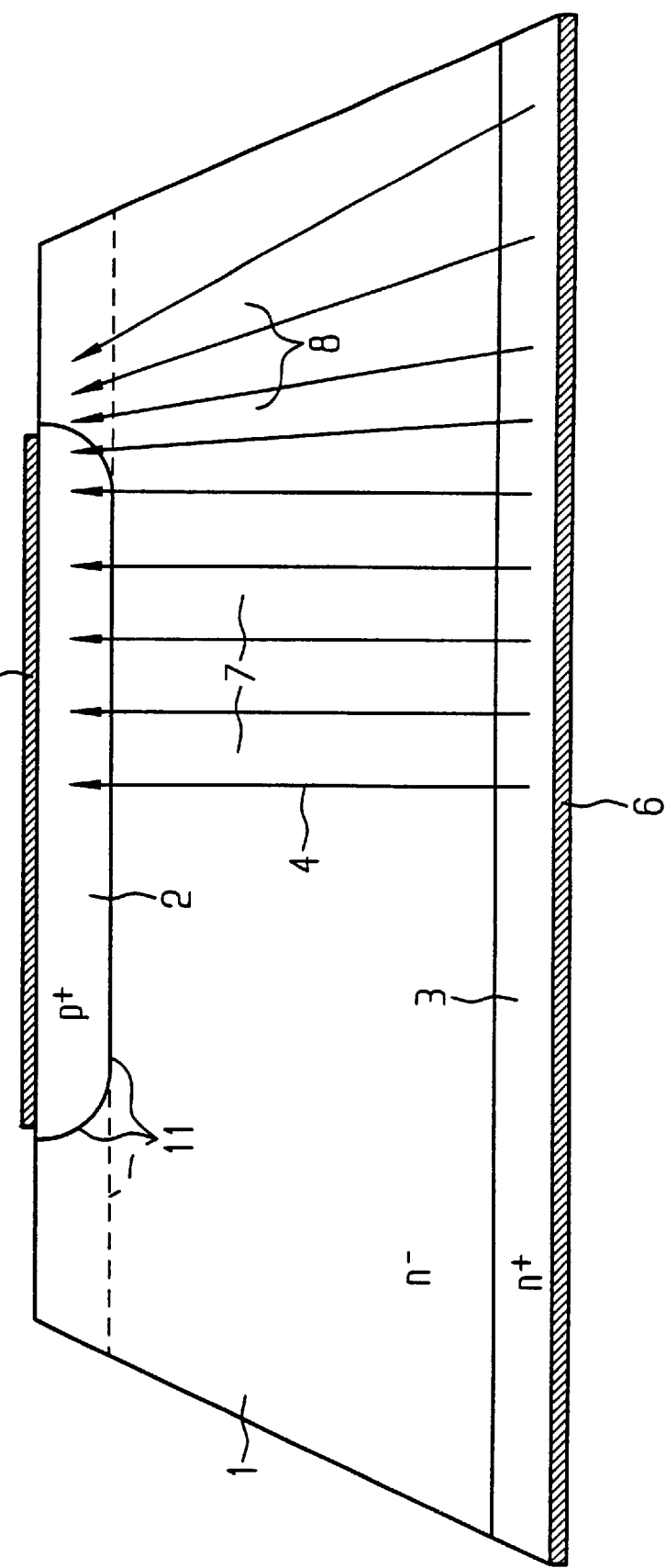
FIG. 1 is a cross-sectional view showing an example of the semiconductor diode according to the invention.

FIG. 1 illustrates a cross-sectional view of a power semiconductor diode. A semiconductor body 1 has a base doping which, in this case, consists of a lower doping concentration for n$^-$-conductivity. In this semiconductor body 1, a highly p$^+$-conductively doped region 2 and a highly n$^+$-conductively doped region 3 are constructed at opposite surfaces. In this example, the p$^+$-conductively doped region 2 forms the pn-junction with the region of the base doping and is limited laterally. The pn-junction 11 extends along the middle plane parallel to a first surface of the semiconductor body and curves laterally toward this first surface. Alternatively, the pn-junction may extend along the middle plane parallel to the first surface as indicated by the dashed line. Contacts 5, 6 for electrical connection are placed on the outer surfaces of the doped regions 2, 3. The contacts 5, 6 are preferably made of metal. The signs of the dopings are indicated in the Figures only as examples and can be reversed.

In an embodiment, the current flow is limited laterally by the laterally limited contact 5 in FIG. 1. A main direction 4 for the current path during the operation of the component is determined by the arrangement of the doped regions 2, 3. This main direction 4 is illustrated here in the flow direction of the electrons.

In a center region 7 of the diode, the current flow is approximately homogenous, which is indicated by the parallel arrows. When the diode is switched off, the charge carriers in an outer region 8 flow to the contact 5, which would result in an increased current density if a lower charge carrier density were not inventively provided in this region.

In a preferred embodiment, the concentration of the recombination centers in the outer region 8 of the diode is increased compared to the middle region 7. These recombination centers are provided to enable the recombination of the charge carriers generated during the operation of the component in the lateral regions, particularly of an arising space charge area. The outer region 8 is modified to this end, which can be effected by an irradiation with high-energy particles or by the introduction of heavy-metal atoms. The portions of the semiconductor body which are not to be modified are covered with masks in the production.

Electrons, protons, or helium can be radiated in as high-energy particles, for example. The masking is constructed such that the radiation impinges on the semiconductor material unimpeded only in the outer region of the component. The mask for covering the central region can be a metal mask, for example consisting of a disk approximately 2 cm thick made of conventional steel, tungsten, iron, molybdenum, or lead, or it can also consist of silicon. Given irradiation with electrons, an electron energy between 1 MeV and 16 MeV, typically about 5 MeV, and an electron density between $10^{13}$ and $10^{15}$ electrons/cm$^2$ is preferably selected. The irradiation results in the generation of centers in the semiconductor material which act as recombination centers for the charge carriers and thereby reduce the charge carrier concentration in the operation of the component.

As an alternative to the irradiation with high-energy particles, heavy-metal atoms can be introduced in the outer region 8 of the component. The heavy-metal atoms can be introduced by a masked implantation or a masked diffusion process. In this exemplifying embodiment, the outer region 8 contains a defined increased concentration of heavy-metal atoms as recombination centers. Such heavy-metal atoms can be gold atoms or platinum atoms, for example.

The lifetime of the charge carriers in the outer region 8 can also be modified by irradiation with gamma rays. To this extent, the recombination rate is increased as a consequence of the additionally generated energy level in the atomic grid of the semiconductor material and storage charges are more rapidly eliminated. Thus shortening the critical hold-off interval of the diode. To this end, a mask is arranged over the edge region, a gamma radiation being generated therein, as bremsstrahlung, by electron irradiation. In order to obtain a suitable dosage of gamma radiation (e.g. $10^{12}$ cm$^2$), the material and/or the thickness of the radiation mask is selected in a corresponding manner. For example, radiation masks made of steel or molybdenum disks, 1 to 2 cm thick, can be used. Since the electron irradiation is normally performed over the whole-surface and is also used for adjusting the carrier lifetime, the inner region of the diode must be covered such that neither electrons nor gamma radiation enter there to any notable degree. This can be achieved by thick metal masks, or more effectively by what is known as a sandwich mask, which generally consists of silicon on top, for trapping the electrons, and lead underneath, for trapping the gamma radiation.

Figure 2:
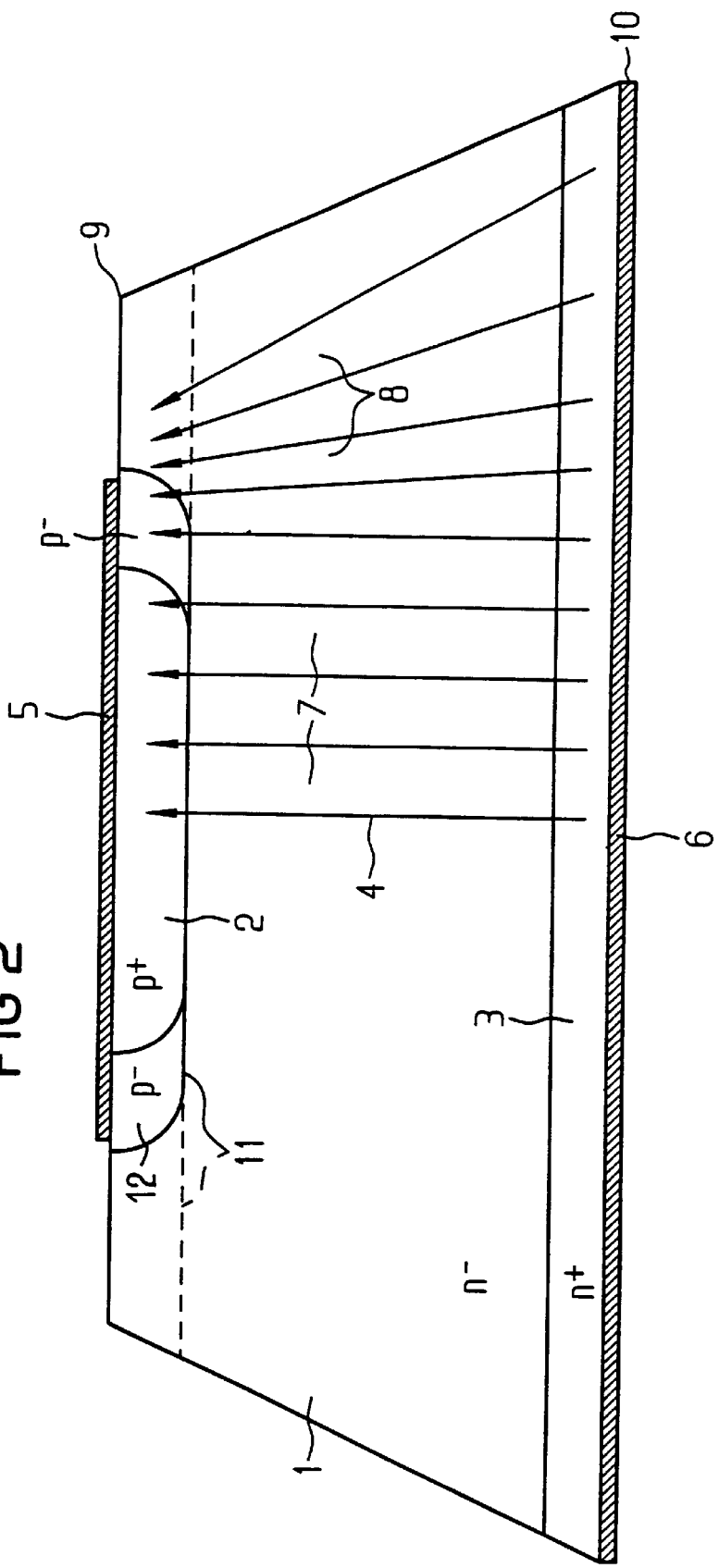
FIG. 2 is a cross-sectional view of the semiconductor diode similar to that shown in FIG. 1 but with a different doping region.

FIG. 2 illustrates a lower charge carrier concentration in the outer region in that the doped region 2 has a lower dopant concentration at the edge of the current path. This is achieved by incorporating region 12 of lower doping concentration (p$^-$ in the example). Instead of a one-stage decrease, a multistage or continuous decrease of doping concentration moving outward is present in the region 2. When the diode is operating, the charge carrier concentration decreases and moves outward. To this end, when the voltage is cut-off in the flow direction, the dynamic avalanche effect does not occur or is only slightly present even given a homogenous distribution of recombination centers. The density of the recombination centers can also be increased in an outward direction by in-diffusion or by radiation, as described above.

The given structure is present by performing an implantation or diffusion process for the doping of the region 2 into a semiconductor body that has a base doping. The temperature and the diffusion time are adapted to the desired dimension of the central $p^+$-region 2, in consideration of the diffusion constant of the dopant. The penetration depth of the dopant can be adjusted by the duration of the tempering process. The different doping concentrations in the regions 2 and 12 can be generated by different dosing of the dopant, preferably with the use of a mask. The outwardly decreasing doping concentration can also be produced with a method as described in the patents cited above.

In the embodiment of FIG. 2, the semiconductor body 1 has the shape of a frustum of a pyramid or a cone, for example. The contact 5 on the smaller base side is limited laterally such that it does not completely cover this base side. Between the contact 5 and the edges 9 of the semiconductor body, which is obtuse-angled on this side, there can be an edge termination that is typical for power semiconductor components, such as another low-doped region. Instead, the contact 5 can cover the smaller base side completely. The pn-junction 11 is then level. The semiconductor body can also be cylindrical or cuboidal.

Figure 3:
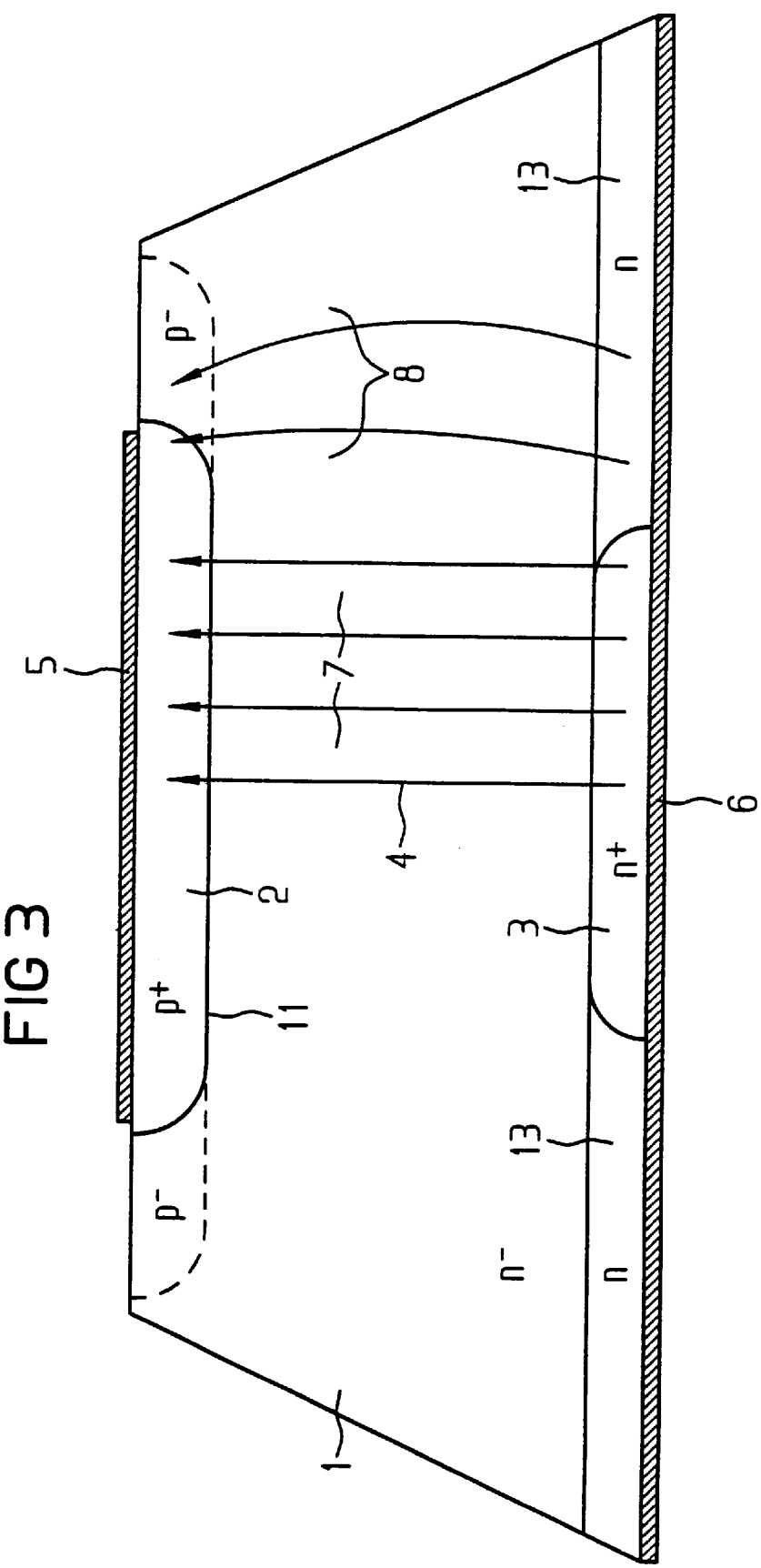
FIG. 3 is a cross-sectional view of the semiconductor diode similar to that shown in FIG. 1 but with a further change in the doping region.

FIG. 3 illustrates an embodiment that has the doped region 3. A contact 6 extends over the whole surface of the larger base side. The doped region 3 is doped lower as one proceeds to the edge of the diode. The lower-doped outer region 13 results in a lower current density in the outer region 8 of the diode. The lower-doped edge regions in the inventive power diode can thus be limited laterally or unlimited laterally (as discussed above) inside the semiconductor body or can be present under a laterally limited or unlimited contact. A limited contact does not completely cover the surface of the semiconductor body. There can be a conventional edge termination of the pn-junction 11, e.g. in the shape of the dashed $p^-$-doped region in the connection to the region 2.

Figure 4:
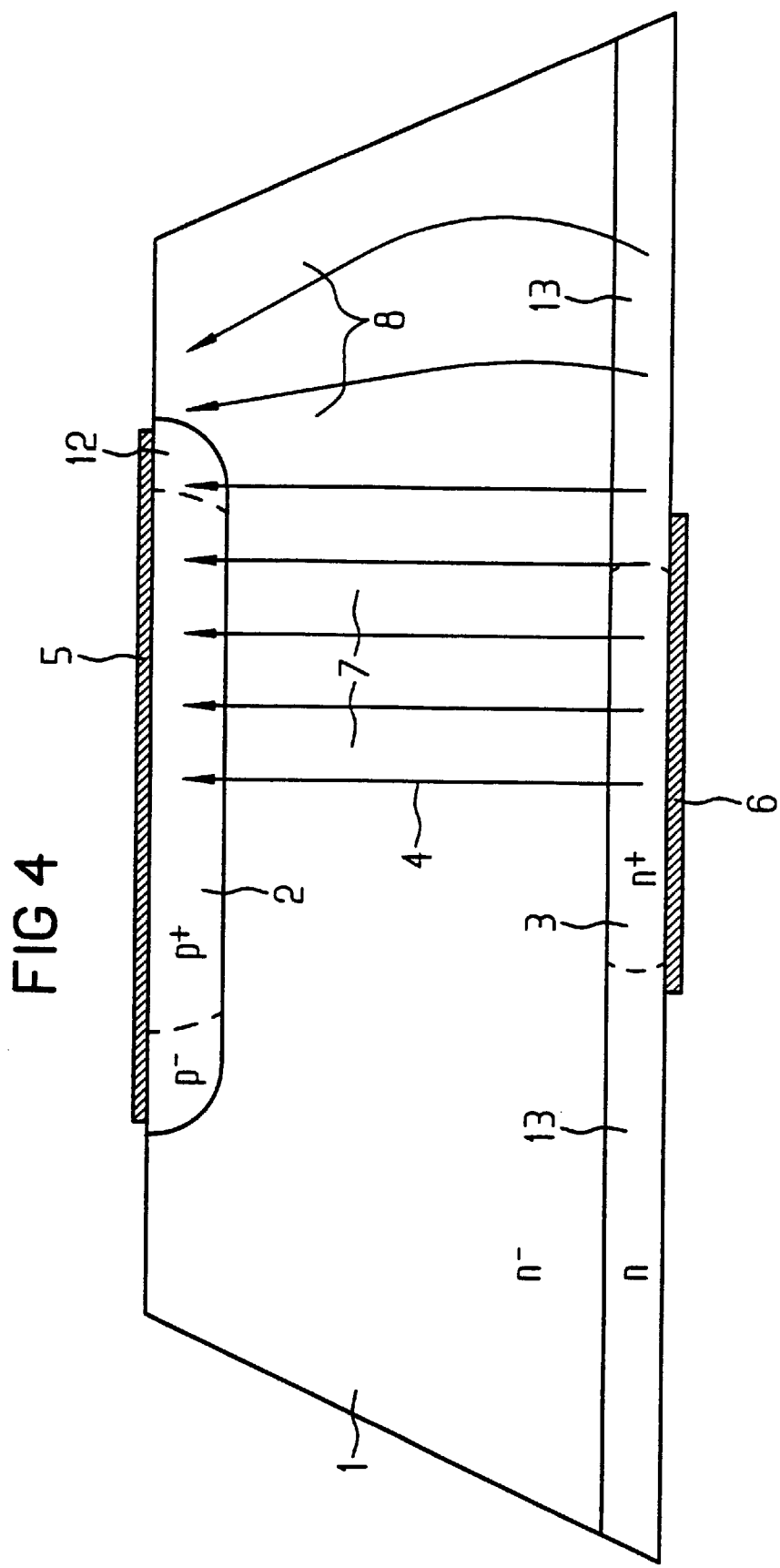
FIG. 4 is a cross-sectional view of another example of the semiconductor diode according to the invention.

Another example of the inventive semiconductor diode is when the two contacts 5, 6 are limited such that they do not completely cover the respective top surface of the semiconductor body. (See FIG. 4) In this embodiment, recombination centers or lower-doped lateral regions may be present, either individually or connected to one another, under one or both contacts, for lowering the charge carrier injection into the lateral region 8 (region 12 or 13 with dashed boundary). The $p^-$-doped region, which is illustrated by a dashed line in FIG. 3, can also be present as an edge termination of the pn-junction. Such an edge termination can be part of the low-doped region 12 for the reduction of the current density at the edge of the current path.

Moreover, the first contact can have dimensions that are larger than the corresponding dimensions of the second contact. In such an embodiment, the power diode has a predetermined thickness. To this extent, the dimensions of the first contact can be larger than the corresponding dimensions of the second contact by, at the most, the thickness of the power diode in every direction in the first surface of the semiconductor body.

FIG. 5 shows an alternative edge termination in a diode incorporating principles of the invention. In this example, the contact 5 is placed onto a mesa 14, to which the semiconductor body is tapered on a top surface by lateral etching. In addition to the upper edge 9 of the mesa 14, the semiconductor body forms another surface at this first surface up to the edge 19 and this surface forms the actual edge. The lower-doped region 12 with a dashed boundary is illustrated as an example here. The contact 6 on the opposite (second) surface can also be limited in the embodiment with a mesa, according to FIGS. 3 and 4, or can be placed on a laterally less-doped region. The features of the described exemplifying embodiments can be combined.

It is seen that this invention provides an improved power diode in semiconductor material that is suitable for circuits in which the diode is operated to the limits of its loading capacity. It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A power diode, comprising:

a semiconductor body having a first surface, a second surface, and a base doping for electrical conductivity;

first and second regions being doped with opposite signs for electrical conductivity, the first region being at the first surface and the second region being at the second surface;

first and second contacts on the first and second regions respectively; and a third region within the semiconductor body having an outer section in which at least one of reducing a concentration of dopant in the first region and increasing a concentration of recombination centers in the outer section lowers a charge carrier concentration in the outer section as to prevent a dynamic break down during cut-off processes, said outer section having a high concentration of recombination centers resulting from a plurality of high-energy particles having been introduced by irradiation.

2. A power diode, comprising:

a semiconductor body having a first surface, a second surface, and a base doping for electrical conductivity, first and second regions being doped with opposite signs for electrical conductivity, the first region being at the first surface and the second region being at the second surface;

first and second contacts on the first and second regions respectively; and a third region within the semiconductor body having an outer section in which at least one of reducing a concentration of dopant in the first region and increasing a concentration of recombination centers in the outer section lowers a charge carrier concentration in the outer section as to prevent a dynamic break down during cut-off processes, said outer section having a high concentration of recombination centers resulting from a plurality of heavy-metal atoms having been introduced by irradiation.

3. A power diode, comprising:

a semiconductor body having a first surface, a second surface, and a base doping for electrical conductivity;

first and second regions being doped with opposite signs for electrical conductivity, the first region being at the first surface and the second region being at the second surface;

first and second contacts on the first and second regions respectively, and a third region within the semiconductor body having an outer section in which at least one of reducing a concentration of dopant in the first region and increasing a concentration of recombination centers in the outer section lowers a charge carrier concentration in the outer section as to prevent a dynamic break down during cut-off processes, a concentration of dopant in the first region being lower in outer edge areas covered by the first contact than a middle area covered by the first contact and extending between the outer edge areas.

4. The power diode in claim 3, wherein the power diode has a thickness and the doping of the first region has a sign of conductivity opposite to the base doping of the semiconductor body, said first contact having dimensions which are larger than the corresponding dimensions of the second contact at the most by the thickness of the power diode in every direction in the plane of the first surface of the semiconductor body.

5. The power diode in claim 3, wherein the doping of the first region has a sign of conductivity opposite to the base doping of the semiconductor body, the second surface is longer than the first surface, the second contact extends across the entire second surface and the doping of the second region has a sign of conductivity that is the same as the conductivity of the base doping of the semiconductor body.

6. The power diode in claim 3, in which the concentration of dopant of the first region steadily decreases in a direction from the middle area to the two outer edge areas covered by the first contact.

7. A power diode, comprising:
a semiconductor body having a first surface, a second surface, and a base doping for electrical conductivity;
first and second regions being doped with opposite signs for electrical conductivity, the first region being at the first surface and the second region being at the second surface;
first and second contacts on the first and second regions respectively; and
a third region within the semiconductor body having an outer section in which at least one of reducing a concentration of dopant in the first region and increasing a concentration of recombination centers in the outer section lowers a charge carrier concentration in the outer section as to prevent a dynamic break down during cut-off processes;
each of the first and second regions have two outer edge areas and a middle area covered by said first and second contacts respectively, said middle area of each region extending between the two outer edge areas of the respective region, a concentration of dopant in the two regions being lower in each of the respective outer edges than in the respective middle areas.

8. A power diode, comprising:
a semiconductor body having a first surface and a second surface opposed to said first surface, said semiconductor body being doped for electrical conductivity;
a first doped region on said first surface;
a second doped region on said second surface;
said first and second doped regions having opposite signs for electrical conductivity;
first and second contacts on said first and second doped regions respectively;
said first doped region and said semiconductor body forming a pn-junction; and
a middle region between said first and second doped regions, said middle region having an outer section in which a charge carrier concentration in the outer section is reduced by at least one of reduction of the concentration of the dopant in the first doped region and by an increase of a concentration of recombination centers in the outer section as to prevent a dynamic break down during cut-off processes, the concentration of recombination centers in the outer section being increased by introducing a plurality of high-energy particles into said outer section by irradiation.

9. A power diode, comprising:
a semiconductor body having a first surface and a second surface opposed to said first surface, said semiconductor body being doped for electrical conductivity;
a first doped region on said first surface;
a second doped region on said second surface;
said first and second doped regions having opposite signs for electrical conductivity,
first and second contacts on said first and second doped regions respectively,
said first doped region and said semiconductor body forming a pn-junction; and
a middle region between said first and second doped regions, said middle region having an outer section in which a charge carrier concentration in the outer section is reduced by a at least one of reduction of the concentration of the dopant in the first doped region and by an increase of a concentration of recombination centers in the outer section as to prevent a dynamic break down during cut-off processes, the concentration of recombination centers in said outer section being increased by introducing a plurality of heavy-metal atoms into said outer section by irradiation.

10. A power diode, comprising:
a semiconductor body having a first surface and a second surface opposed to said first surface, said semiconductor body being doped for electrical conductivity;
a first doped region on said first surface;
a second doped region on said second surface;
said first and second doped regions having opposite signs for electrical conductivity;
first and second contacts on said first and second doped regions respectively;
said first doped region and said semiconductor body forming a pn-junction; and
a middle region between said first and second doped regions, said middle region having an outer section in which a charge carrier concentration in the outer section is reduced by at least one of reduction of the concentration of the dopant in the first doped region and by an increase of the concentration of recombination centers in the outer section as to prevent a dynamic break down during cut-off processes;
an area of the first doped region under said first contact has outer edge areas and a middle area therebetween and a concentration of the dopant being greater in said middle area than in said outer edge areas.

* * * * *